(12) United States Patent
Mitani et al.

(10) Patent No.: US 6,242,294 B1
(45) Date of Patent: *Jun. 5, 2001

(54) METHOD FOR FABRICATING A SEMICONDUCTOR DEVICE

(75) Inventors: Junichi Mitani; Makoto Yasuda, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/111,796

(22) Filed: Jul. 8, 1998

(30) Foreign Application Priority Data

Dec. 19, 1997 (JP) .................................... 9-350862

(51) Int. Cl.$^7$ ................................................ H01L 21/8238
(52) U.S. Cl. ....................... 438/228; 438/286; 257/371
(58) Field of Search ................................. 438/228, 286; 257/349, 371

(56) References Cited

U.S. PATENT DOCUMENTS

| | | | |
|---|---|---|---|
| 5,114,868 | * 5/1992 | Yoshida | 438/228 |
| 5,342,802 | * 8/1994 | Kubokoya et al. | 438/228 |
| 5,578,509 | * 11/1996 | Fujita | 438/286 |
| 5,698,458 | * 12/1997 | Hsue et al. | 438/228 |
| 5,759,884 | * 6/1998 | Youn | 438/228 |
| 5,831,313 | * 11/1998 | Han et al. | 438/228 |
| 5,953,603 | * 9/1999 | Kim | 438/202 |
| 5,966,599 | * 10/1999 | Walker et al. | 438/228 |
| 5,985,709 | * 11/1999 | Lee et al. | 438/228 |

* cited by examiner

*Primary Examiner*—Charles Bowers
*Assistant Examiner*—David S Blum
(74) *Attorney, Agent, or Firm*—Armstrong, Westerman, Hattori, McLeland & Naughton, LLP

(57) ABSTRACT

The semiconductor device according to the present invention comprises: a semiconductor substrate 10 of a first conductivity type; a well 28 of a second conductivity type different from the first conductivity type formed in a region 18 surrounding a region 20 of the semiconductor substrate 10; a diffused layer 42 of the second conductivity type formed, buried in the semiconductor substrate 10 in the region 20 and connected to the well 28 on a side thereof; and a well 44 of the first conductivity type formed in the semiconductor substrate 10 in the region 20 on the side of a surface thereof and electrically isolated from a rest region of the semiconductor substrate 10 by the well 28 and the diffused layer 42. This constitution of the semiconductor device permits the diffused layer 42 and the well 28 to be formed by the use of one and the same mask, whereby in electrically isolating well 44 from the semiconductor substrate by the well 28 and the diffused layer 42, the triple well can be formed without increasing lithography steps.

15 Claims, 16 Drawing Sheets

PRIOR ART

METHOD FOR FABRICATING A SEMICONDUCTOR DEVICE

BACKGROUND OF THE INVENTION

The present invention relates to a semiconductor device and a method for fabricating the same, more specifically to a semiconductor device having a triple well structure and a method for fabricating the same.

Recently, it is required in various semiconductor devices, such as DRAMs, non-volatile memories, etc. that specific voltages are applied to a plurality of wells, and the so-called triple well structure in which in addition to usual N-well and P-well, a third well having a well formed in a P-well or an N-well and having a conductivity type different from that of the P-well or the N-well is noted. A method for forming the triple well structure by high-energy ion implantation is especially advantageous in terms of throughput and is expected to be developed.

A conventional method of fabricating a semiconductor device for forming the triple well structure by high-energy ion implantation will be explained with reference to FIGS. 14A–14C, 15A–15C and 16A–16C. FIGS. 14A–14C, 15A–15C and 16A–16C are sectional views of the semiconductor device in the steps of the conventional method for fabricating a semiconductor device, which explain the method.

In this explanation, a DRAM having a usual CMOS wells, a P-well for a peripheral circuit, which is formed in an N-well and having a voltage different from that of the CMOS P-well, and a P-well for a memory cell, which is formed in an N-well will be exemplified.

First, a field oxide film 102 is formed on a P-type silicon substrate 100 by, e.g., the usual LOCOS (LOCal Oxidation of Silicon) method. In FIG. 14A, a device region defined by the field oxide film 102 corresponds to, from the left in the drawing, a PMOS region 104 for a peripheral circuit, an NMOS region 106 for a peripheral circuit, an NMOS region 108 for a peripheral circuit formed in a different-voltage well and a memory cell region 110.

Then, the silicon substrate is thermally oxidized by dry oxidation at, e.g., 900° C. to form an about 10 nm-thick silicon oxide film 112 in the device region (FIG. 14A).

Subsequently, a photoresist 114 exposing the PMOS region 104, the NMOS region 108 and the memory cell region 110 is formed by the usual lithography.

Then, phosphorus ions are implanted with the photoresist 114 as a mask to form N-type diffused layers 116, 118 in regions inside the silicon substrate 100 (FIG. 14B). The phosphorus ions are implanted at, e.g., 1 MeV acceleration energy and a $3 \times 10^{13}$ cm$^{-2}$ dose.

The N-type diffused layers 116, 118 are for forming parts having higher concentrations in the bottoms of the wells. Conditions for the ion implantation are restricted by punch-through resistance between the P-well in the N-well and the silicon substrate 100 and the latch-up resistance.

Then, the photoresist 114 is removed, and then a photoresist 120 exposing the PMOS region 104 and the NMOS region 108 is formed by the usual lithography.

Subsequently, with the photoresist 120 as a mask phosphorus ions are implanted to form N-wells 122, 124 connected to the N-type diffused layers 116, 118 (FIG. 14C).

This ion implantation is performed, e.g., at 200 keV acceleration energy and a $4 \times 10^{12}$ cm$^{-2}$ dose, and 80 keV acceleration energy and a $1 \times 10^{12}$ cm$^{-2}$ dose. The higher energy implantation corresponds to channel stop ion implantation for maintaining a threshold voltage of a field transistor sufficiently high, and the lower energy implantation corresponds to ion implantation for threshold voltage control of a PMOS transistor in the PMOS region 104.

The thus formed N-well 124 finally functions to electrically isolate the different-voltage P-well from the silicon substrate 100 and is formed in an annular region surrounding the memory cell region 110.

Next, the photoresist 120 is removed, and then a photoresist 128 exposing the NMOS region 106 and a region 126 inside the NMOS region 108, where the P-well is to be formed. The region 126 for the P-well to be formed in is arranged to position inside the inner edge of the N-well 124, and the outer edge of the N-well 124 is covered with the photoresist 128.

Subsequently, boron ions are implanted with the photoresist 128 as a mask to form a P-well 130 in the silicon substrate 100 in the NMOS region 106 and a P-well 132 in the silicon substrate 100 in the region 126 for the P-well to be formed in (FIG. 15A). The P-well 132 is electrically isolated from the silicon substrate 100 by the N-type diffused layer 118 positioned below the P-well 132, and accordingly is formed to be shallower than the N-type diffused layer 118.

The ion implantation for forming the P-wells 130, 132 are performed three times by implanting boron ions, e.g., at a 180 keV acceleration energy and a $1.5 \times 10^{13}$ cm$^{-2}$ does in the first implantation, at a 100 keV acceleration energy and a $4 \times 10^{12}$ cm$^{-2}$ dose in the second implantation, and at a 50 keV acceleration energy and a $1 \times 10^{12}$ cm$^{-2}$ dose in the third implantation.

The ion implantation at the high energy (180 keV) is for forming a heavily-doped part at the bottom of the P-wells 130, 132 and is determined by punch-through resistance and latch-up resistance between the n-type source/drain of the NMOS formed in the NMOS region 108, and the N-type diffused layer 118.

The ion implantation at the middle energy (100 keV) is for channel stop for maintaining a threshold voltage of the field transistor sufficiently high.

The ion implantation at the low energy (50 keV) is for controlling threshold voltages of the NMOS in the NMOS regions 106, 108.

Then, the photoresist 128 is removed to perform in the entire surface of the silicon substrate 100 ion implantation of, boron ions at, e.g., 18 keV acceleration energy and a $2 \times 10^{12}$ cm$^{-2}$ dose, whereby the PMOS formed in the N-well 122 and the NMOS formed in the P-wells 130, 132 can have threshold voltages of required values.

Then, a photoresist 134 exposing the memory cell region 110 is formed by the usual lithography techniques.

Subsequently, boron ions are implanted with the photoresist 134 as a mask to form the P-well 136 in the side of the memory cell region 110 opposed to the surface of the silicon substrate 100 (FIG. 15B).

Boron ions are implanted four times at, e.g., 180 keV acceleration energy and a $5 \times 10^{12}$ cm$^{-2}$ dose in the first ion implantation, 100 kev acceleration energy and a $2 \times 10^{12}$ cm$^{-2}$ in the second ion implantation, 50 keV acceleration energy and a $1 \times 10^{12}$ cm$^{-2}$ dose in the third ion implantation, and 18 keV acceleration energy and a $5 \times 10^{12}$ cm$^{-2}$ dose in the fourth ion implantation.

The ion implantation at the high energy (180 keV) is for forming a heavily doped part at the bottom of the P-well 136 and is determined by punch-through resistance and latch-up resistance between the source/drain of the NMOS formed in the memory cell region 110 and the N-type diffused layer 118.

The ion implantation at the middle energy (100 keV) is for maintaining a threshold voltage of the field transistor sufficiently high.

The ion implantation at the low energy (50 keV and 18 keV) is for controlling threshold voltages of the NMOS in the memory cell regions 110.

As described above, the conventional semiconductor fabrication method needs four lithography steps to form the triple-well structure including the N-wells 122, 124, the P-well 130 and the different-voltage P-wells 132, 136 (FIG. 15C).

The photoresist 128*a* shown in FIG. 16A is used in the step of FIG. 15A to concurrently form the P-wells 120, 132, 136. However, in this case it is necessary to separately conduct the step of the ion implantation for the NMOS in the memory cell region 110 having an adjusted threshold voltage, and to this end, the step of forming the photoresist 134*a* exposing the memory cell region 110 is needed (FIG. 16B). Consequently this makes no change to the number of the lithography steps.

As described above, the above-described conventional semiconductor device fabrication method needs two lithography steps of forming the N-wells 122, 124 and the N-type diffused layers 116, 118 for electrical isolation of the P-wells 132, 136 from the silicon substrate 100. That is, the method needs totally four lithography steps for forming the triple-well structure, which is increased by one lithography in comparison with the process for forming the usual CMOS twin-well structure.

SUMMARY OF THE INVENTION

An object of the present invention is to provide a semiconductor device and the method for fabricating the same which enables a triple-well structure by a decreased number of lithography steps.

The above-described object is achieved by a semiconductor device comprising: a semiconductor substrate of a first conductivity type; a first well of a second conductivity type different from the first conductivity type, which is formed in a second region surrounding a first region of the semiconductor substrate; a first diffused layer formed, buried in the semiconductor substrate in the first region and connected to the first well at a side thereof; and a second well of the first conductivity type formed in the semiconductor substrate in the first region on the side of a surface of the semiconductor substrate and electrically isolated from a rest region of the semiconductor substrate by the first well and the first diffused layer. This constitution of the semiconductor device permits the first diffused layer and the second well to be formed by the use of one and the same mask, whereby in electrically isolating the second well from the semiconductor substrate by the first well and the first diffused layer the triple well can be formed without increasing lithography steps. In comparison with the conventional device having the triple well structure by using four lithography steps, the semiconductor device according to the present invention can have improved throughputs and reduced fabrication costs.

In the above-described semiconductor device, it is preferable that the semiconductor device further comprises: a third well of the first conductivity type formed in the semiconductor substrate in the second region on the side of the surface of the semiconductor substrate and electrically isolated from the rest region of the semiconductor substrate by the first well and the first diffused layer. An impurity in the first well of the second conductivity type is compensated to form the third well of the first conductivity type, whereby an effective carrier concentration of the third well can be reduced. The third well can be used as a region where a transistor of a low threshold voltage, such as a sense amplifying circuit, for example, of a DRAM or others, can be formed.

In the above-described semiconductor device, it is preferable that the semiconductor device further comprises: a second diffused layer of the second conductivity type formed, buried in the semiconductor substrate of a third region of the semiconductor substrate; and a fourth well of the first conductivity type formed in the semiconductor substrate in the third region on the side of the surface of the semiconductor substrate and electrically connected to the rest region of the semiconductor substrate. The constitution of the semiconductor device allows the fourth well electrically connected to the semiconductor substrate and the second well to be concurrently formed, whereby lithography steps for forming the triple well structure can be reduced. In comparison with the conventional device having the triple well structure by using four lithography steps, the semiconductor device according to the present invention can have improved throughputs and reduced fabrication costs.

In the above-described semiconductor device, it is preferable that a concentration of an impurity of the second conductivity type in the first diffused layer is different from a concentration of the impurity of the second conductivity type in the first well at a depth where the fist diffused layer is formed. In the above-described semiconductor device a concentration of an impurity of the second conductivity type in the first diffused layer and a concentration of an impurity of the second conductivity type in the first well at a depth at which the first diffused layer is formed can be controlled independent of each other in accordance with characteristics required of the first and the second wells.

In the above-described semiconductor device, it is preferable that a depth of a bottom of the first diffused layer is different from a depth of a bottom of the first well. In the above-described semiconductor device a depth of the bottom of the first diffused layer and a depth of the bottom of the first well can be controlled independently of each other in accordance with characteristics required of the first and the second wells.

The above-described object can be also achieved by a method for fabricating a semiconductor device comprising the steps of: forming a first well in a second region surrounding a first region of a semiconductor substrate of a first conductivity type, which has a second conductivity type different from the first conductivity type; forming a first diffused layer of the second conductivity type, buried in the semiconductor substrate of the first region and connected to the first well on a side thereof; and forming a second well of the first conductivity type in the semiconductor substrate in the first region on the side of a surface of the semiconductor substrate, which is electrically isolated from a rest region of the semiconductor substrate by the first well and the first diffused layer. A thus-fabricated semiconductor device can have a triple well structure including the second well electrically isolated from the semiconductor substrate by the first diffused layer and the first well.

In the above-described method for fabricating a semiconductor device, it is preferable that the method further comprises the step of: forming a third well of the first conductivity type in the semiconductor substrate in the second region on the side of the surface of the semiconductor substrate, which is electrically isolated from a rest region of the semiconductor substrate by the first well and the first diffused layer. An impurity in the first well of the second conductivity type is compensated to form the third well of the first conductivity type, whereby an effective carrier concentration of the third well can be reduced. The third well can be used as a region where a transistor of a low threshold voltage, such as a sense amplifying circuit, for example, of a DRAM or others, can be formed.

In the above-described method for fabricating a semiconductor device, it is preferable that in the step of forming the second well or the step of forming the third well, a fourth well of the first conductivity type is concurrently formed in a third region of the semiconductor substrate, electrically connected to the rest region of the semiconductor substrate. The second well or the third well can be formed concurrently with the fourth well electrically connected to the semiconductor substrate, which does not make the semiconductor device fabrication process complicated.

In the above-described method for fabricating a semiconductor device, it is preferable that in the step of forming the first diffused layer, a second diffused layer of the second conductivity type is concurrently formed below the fourth well. By thus fabricating the semiconductor device the fourth well electrically connected to the semiconductor substrate, and the second well can be concurrently formed, which makes it possible to decrease lithography steps for forming the triple well structure.

In the above-described method for fabricating a semiconductor device, it is preferable that in the step of forming the first diffused layer and the step of forming the second well, the first diffused layer and the second well are formed by the use of one and the same mask. The first diffused layer and the second well can be formed by using one and the same mask material, whereby the triple well can be formed without increasing lithography steps in electrically isolating the second well from the semiconductor substrate by the first well and the fist diffused layer.

In the above-described method for fabricating a semiconductor device, it is preferable that in the step of forming the first well and/or the step of forming the second well, the well is formed by plural times of ion implantation, which are different from each other in acceleration energy and dose. By thus forming the wells the so-called retrograde well can be formed, and in comparison with forming a triple well of the conventional wells, the method according to the present invention can improve throughputs.

In the above-described method for fabricating a semiconductor device, it is preferable that in the step of forming the first well and/or the step of forming the first diffused layer, the ion implantation is performed in a direction tilted with respect to a normal direction of the semiconductor substrate. By thus forming the first well or the first diffused layer, even when disalignment occurs due to lithography, a gap between the first well and the first diffused layer can be buried, whereby the second well can be electrically isolated from the semiconductor substrate without failure.

In the above-described method for fabricating a semiconductor device, it is preferable that a first mask pattern for forming the first well and a second mask pattern for forming the first diffused layer have regions between the first region and the second region, in which openings overlap each other. Also by thus forming the first and the second mask patterns, even when disalignment occurs due to lithography, a gap between the first well and the first diffused layer can be buried, whereby the second well can be electrically isolated from the semiconductor substrate without failure.

In the above-described method for fabricating a semiconductor device, it is preferable that a dose for the ion implantation for forming the second well is smaller than a dose for the ion implantation for forming the third well. By thus fabricating a semiconductor device, the second well have a lower surface concentration, and, in addition, the semiconductor substrate in the second well is less damaged. Accordingly, in a case that, for example, the second well is used as a memory cell region of a DRAM, improved refresh characteristic can be obtained.

In the above-described method for fabricating a semiconductor device, it is preferable that acceleration energy for the ion implantation for forming the second well is higher than acceleration energy for the ion implantation for forming the third well. Also by performing at higher acceleration energy the ion implantation for forming the second well, the second well have a lower surface concentration, and, in addition, the semiconductor substrate in the second well is less damaged. Accordingly, in a case that, for example, the second well is used as a memory cell region of a DRAM, improved refresh characteristic can be obtained.

In the above-described method for fabricating a semiconductor device, it is preferable that a dose of the ion implantation for forming the first diffused layer is smaller than a dose for the ion implantation at a highest acceleration energy for forming the first well. By thus fabricating a semiconductor device the semiconductor substrate in the second well region is less damaged. Accordingly, in a case that, for example, the second well is used as a memory cell region of a DRAM, improved refresh characteristic can be obtained.

In the above-described method for fabricating a semiconductor device, it is preferable that acceleration energy for the ion implantation for forming the first diffused layer is higher than acceleration energy for the ion implantation for forming the first well. Also by performing at higher acceleration energy the ion implantation for forming the first diffused layer the semiconductor substrate in the second well region is less damaged. Accordingly, in a case that, for example, the second well is used as a memory cell region of a DRAM, improved refresh characteristic can be obtained.

DETAILED DESCRIPTION OF THE INVENTION

[A First Embodiment]

The semiconductor device and the method for fabricating the same according to a first embodiment of the present invention will be explained with reference to FIGS. 1, 2A–2C, 3A–3B, 4A–4C, 5A–5B and 6A–6B.

Figure 1:
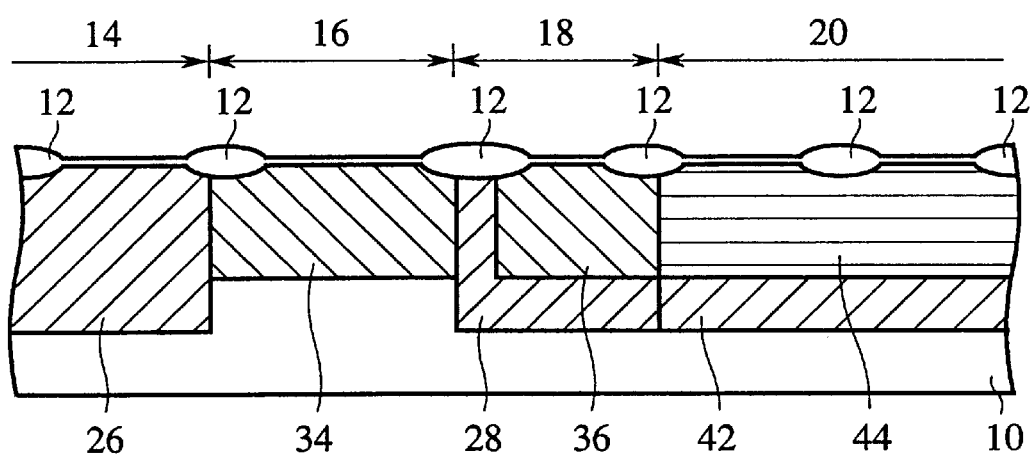
FIG. 1 is a diagrammatic sectional view of the semiconductor device according to a first embodiment of the present invention, which shows a structure thereof.

FIG. 1 is a diagrammatic sectional view of the semiconductor device according to the present embodiment, which shows a structure thereof. FIGS. 2A–2C and 3A–3B are sectional views of the semiconductor device according to the present embodiment in the steps of the method for fabricating the same, which explain the method. FIGS. 4A–4C show explanatory views of another process for forming an N-type diffused layer of the method for fabricating the semiconductor device. FIGS. 5A–5B and 6A–6B are diagrammatic sectional views of the semiconductor device according to the modifications of the present embodiment, which show structures thereof and the method for fabricating the same.

First, a structure of the semiconductor device according to the present embodiment will be explained with reference to FIG. 1.

A field oxide film 12 for defining device regions is formed on a P-type silicon substrate 10. In FIG. 1, the device regions defined by the field oxide film 12 are, from the left to the right as viewed in FIG. 1, a PMOS region 14 for a peripheral circuit, an NMOS region 16 for a peripheral circuit, an NMOS region 18 for a peripheral circuit formed in a different voltage well, and a memory cell region 20. In this specification, the PMOS region means a region where the P-channel MOS transistors are to be formed in. The NMOS region means a region where the N-channel MOS transistors are to be formed in. In the silicon substrate 10 in the PMOS region 14, an N-well 26 which is one of the usual CMOS wells is formed. In the silicon substrate 10 in the NMOS region 16 a P-well 34 which is the other CMOS well. In the silicon substrate 10 of the NMOS region 18, a P-well 36 which is formed on the side of the surface of the silicon substrate 10, and an N-well 28 which covers the side and the bottom of the P-well 36. In the silicon substrate 10 of the memory cell region 20, a P-well 44 formed in the side of the surface of the silicon substrate 10, and an N-type diffused layer 42 formed on the bottom of the P-well 44. The P-well 36 and the P-well 44 are connected to each other. The N-well 28 is formed in an annular region surrounding the P-well 36 and the memory cell region and is connected to the N-type diffused layer 42 in the silicon substrate 10. Thus, the P-wells 36, 44 are electrically isolated from the silicon substrate 10 by the N-well 28 and the N-type diffused layer 42.

Thus, a triple well structure is constituted by the N-wells 26, 28, the P-well 34, and the different voltage P-wells 36, 44.

In such triple well structure used in, e.g., a DRAM, the PMOS region 14 and the NMOS region 16 are for forming a logic circuit, the NMOS region 18 is for forming a sense amplifier, and the memory cell region 20 is for a memory array.

A major characteristic of the semiconductor device according to the present embodiment is that a concentration of the N-well 28 covering the side and the bottom of the P-well 36, and a concentration and a depth of the N-type diffused layer 42 covering the bottom of the P-well 44 can be varied independently of each other. This structure of the semiconductor device permits the N-type diffused layer 42 covering the bottom of the P-well 44 or the N-well covering the bottom of the P-well 36 to have a concentration adjusted corresponding to characteristics of devices to be formed in the NMOS region 18 and the memory cell region 20.

Then, the present invention will be detailed in accordance with the method for fabricating the semiconductor device according to the present embodiment.

First, the field oxide film 12 is formed on the P-type silicon substrate 10 by, e.g., the usual LOCOS method to define the device regions.

For example, first, the silicon substrate 10 is oxidized to form an about 3 nm-thick silicon oxide film (not shown). Then, an about 115 nm-thick silicon nitride film (not shown) is formed on the silicon oxide film by, e.g., CVD method. Subsequently, the silicon nitride film is patterned by the usual lithography and etching techniques to remain the silicon nitride film in the regions to be the device regions. Then, with the patterned silicon nitride film as a mask the silicon substrate 10 thermally oxidized by wet oxidation at 1000° C. to form the field oxide film 12. Next, the silicon nitride film and the silicon oxide film are removed.

Figure 2A:
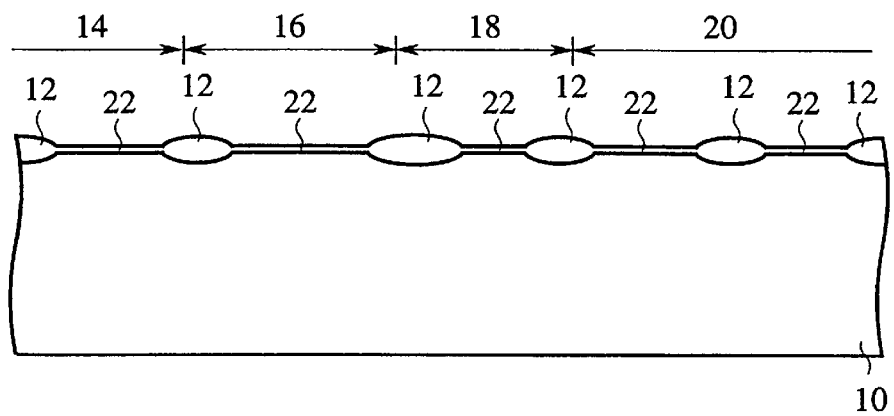
FIGS. 2A–2C and 3A–3B are sectional views of the semiconductor device in the steps of the method for fabricating the semiconductor device, which explain the method.

Then, the silicon substrate 10 is thermally oxidized by, e.g., dry oxidation at 900° C. to form an about 10 nm-thick silicon oxide film 22 in the device regions (FIG. 2A).

Subsequently, a photoresist 24 exposing the PMOS region 14 and the NMOS region 18 is formed by the usual lithography techniques.

Figure 2B:
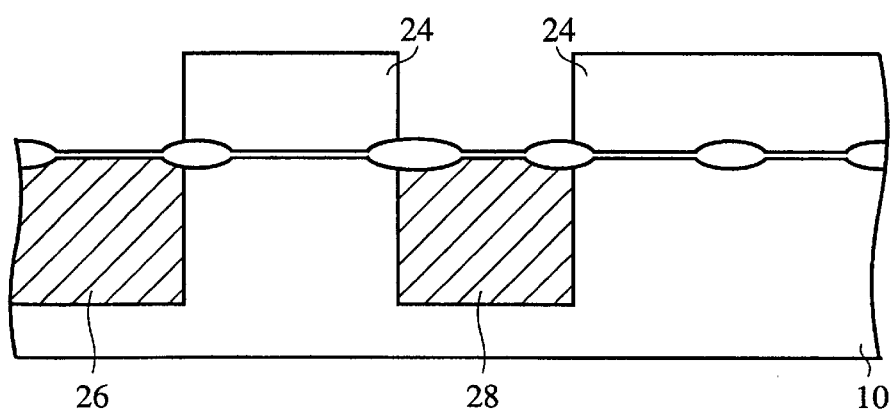

Then, phosphorus ions are implanted with the photoresist 24 as a mask to form the N-well 26 in the silicon substrate 10 in the PMOS region 14, and the N-well 28 in the silicon substrate 10 in the NMOS region 18 (FIG. 2B).

The thus-formed N-well 28 finally functions to electrically isolate the different-voltage P-wells 36, 44 from the silicon substrate 10 and is formed in the annular region surrounding the memory cell region 20.

The ion implantation for forming the N-wells 26, 28 is performed, for example, three times; phosphorus ions are implanted firstly at 1 MeV acceleration energy and a $3 \times 10^{13}$ $cm^{-2}$ dose, secondly at 200 keV acceleration energy and a $4 \times 10^{12}$ $cm^{-2}$ dose and thirdly at 80 keV acceleration energy and a $1 \times 10^{12}$ $cm^{-2}$ dose. The ion implantation is performed three times at thus varied acceleration energy and doses, whereby the so-called retrograde well can be formed.

The ion implantation at the high energy (1 MeV) is for forming heavily-doped parts on the bottoms of the N-wells 26, 28, and is determined by punch-through resistance and latch-up resistance between a P-type source/drain to be formed in the N-well 26 and the silicon substrate 10 and between the P-well 36 to be formed in the N-well 28 and the silicon substrate 10.

The ion implantation at the middle energy (200 keV) is for channel stop for retaining a threshold voltage of the field transistor sufficiently high.

The ion implantation at the low energy (80 keV) is for controlling a threshold voltage of the PMOS in the PMOS region 14.

The impurity introduced into the silicon substrate 10 by the ion implantation is not yet activated immediately after the implantation and is activated for the first time by a heat treatment in a later step. In the specification, however, for the convenience of explanation, the regions immediately after the ion implantation are called "wells" or "diffused layers".

Then, after the photoresist 24 is removed, a photoresist 32 exposing the NMOS region 16, a region 30 for the P-well in the NMOS region 18 to be formed in is formed by the usual lithography techniques. The region 30 for the P-well to be formed in is arranged so as to be located on the side of the inner edge of the N-well 28 with a part thereof on the side of the outer edge covered with the photoresist 32.

Figure 2C:
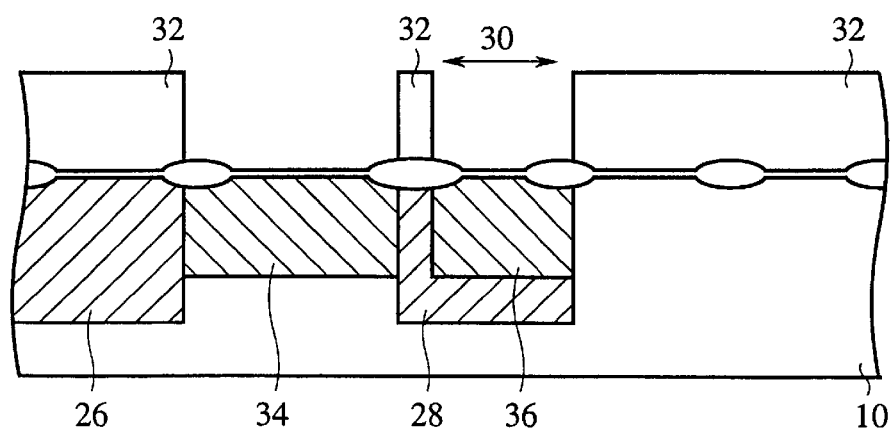

Subsequently, boron ions are implanted with the photoresist 32 as a mask to form the P-well 34 in the silicon substrate 10 in the NMOS region 16 and the P-well 34 in the silicon substrate 10 in the region for the P-well to be formed in (FIG. 2C). The P-well 36 is finally electrically isolated from the N-well 28 located below the P-well 36 and accordingly must be formed shallower than the N-well 28.

The ion implantation for forming the P-wells 34, 36 is performed, for example, three times by implanting boron ions at 180 keV acceleration energy and a $1.5 \times 10^{13}$ cm$^{-2}$ dose, at 100 kev acceleration energy and a $4 \times 10^{12}$ cm$^{-2}$ dose and at 50 keV acceleration energy and a $1 \times 10^{12}$ cm$^{-2}$ dose. The ion implantation is performed three times at thus varied acceleration energy and doses, whereby the so-called retrograde wells can be formed.

The ion implantation at the high energy (180 keV) is for forming heavily-doped parts on the bottoms of the P-wells 34, 36, and is determined by punch-through resistance and latch-up resistance between the N-type source/drain of the NMOS to be formed in the NMOS region 18 and the N-well 28.

The ion implantation at the middle energy ($\phi$keV) is for channel stop for retaining a threshold voltage of the field transistor sufficiently high.

The ion implantation at the low energy (50 keV) is for controlling threshold voltages of the NMOS in the NMOS regions 16, 18. This ion implantation is also for the purpose of compensating impurity concentrations between the channel stop region and a region in which ion implantation is to be performed at 18 keV acceleration energy as will be described later but is not essential if the ion implantation at the low energy can be performed by the rest ion implantation.

Although the N-well 28 is formed in the silicon substrate 10 in the region 30 for the P-well to be formed in, the N-type impurity is compensated by the boron ion implantation, and the N-well 28 substantially becomes P-type, whereby the P-well 36 can be formed in the N-well 28. Forming the P-well 36 in the N-well 28 by implanting boron ions in the N-well 28 is for reducing an effective carrier concentration in the P-well 36. That is, a sense amplifier circuit is often provided in the NMOS region 18, and it is preferable for higher operational speed that the NMOS transistor used in the sense amplifier circuit has a lower threshold voltage than the transistor used in the logic circuit. On the other hand, in terms of simplifying fabrication process, it is preferable to concurrently perform ion implantation for the threshold voltage control of the transistors to be formed in the NMOS regions 16, 18. To this end, it is necessary to differ from each other carrier concentrations of the P-wells 34, 36 to be formed in the NMOS regions 16, 18. In the present embodiment, the P-well 36 is formed in the N-well 28 to make an effective carrier concentration of the P-well 36 lower than that of the P-well 34, whereby the MOS transistor formed in the NMOS region 18 has a lower threshold voltage. Accordingly, when it is unnecessary that a part of a peripheral circuit, such as the sense amplifier or others, is formed in the different-voltage P-well 44, the P-well 36 is not essentially formed.

The P-wells 34, 36 are thus formed to thereby surround the bottom and the side of the P-well 36 by the N-well 28.

Then, the photoresist 32 is removed, and boron ions are implanted in the entire surface of the silicon substrate 10 at, e.g., 18 keV acceleration energy and a $2 \times 10^{12}$ cm$^{-2}$ dose. Thus, threshold voltages of the PMOS formed in the N-well 26 and of the NMOS formed in the P-wells 34, 36 are adjusted to be required threshold values.

Then, a photoresist 40 exposing the memory cell region 20 is formed by the usual lithography techniques.

Subsequently, with the photoresist 40 as a mask, phosphorus ions are implanted to for the N-type diffused layer 42 connected to the N-well 28 in the silicon substrate 10 in the memory cell region 20. Phosphorus ions are implanted at, e.g., 1 MeV acceleration energy and a $3 \times 10^{13}$ cm$^{-2}$ dose. A dose of phosphorus ions to be implanted to form the N-type diffused layer 42 is determined by punch-through characteristic between the P-well 44 and the silicon substrate 10.

In the present embodiment, the ion implantation for forming the N-type diffused layer 42 and the ion implantation at the highest energy for forming the N-wells 26, 28 are performed on the same conditions (of 1 MeV acceleration energy and a $3 \times 10^{13}$ cm$^{-2}$ dose) but are not essentially performed on the same conditions.

For example, by setting a dose for forming the N-type diffused layer 42 low (e.g., at $1 \times 10^{13}$ cm$^{-2}$), damage to the surface of the silicon substrate by the ion implantation can be decreased, and a surface concentration can be low, and improved refresh characteristic can be obtained.

That is, by decreasing a dose for the N-type diffused layer 42, a concentration indicated by the one-dot chain line in FIG. 4A is changed to a concentration shown in FIG. 4B.

The refresh characteristic can be improved by, in place of decreasing a dose, raising acceleration energy to extend damage by the ion implantation deeper from the substrate surface (FIG. 4C). In this case it is necessary to set the energy so as to connect the N-well 28 and the N-type diffused layer 42 to each other.

Figure 3A:
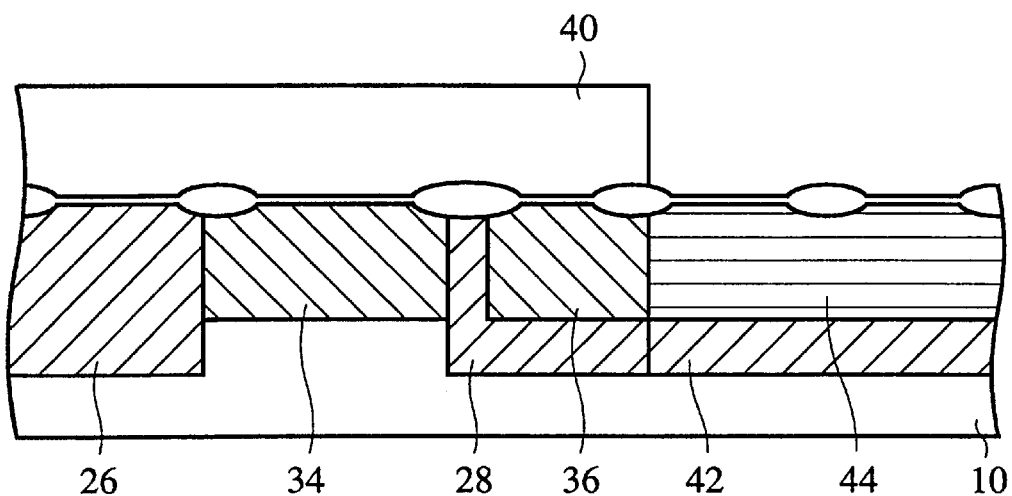
Figure 4A:
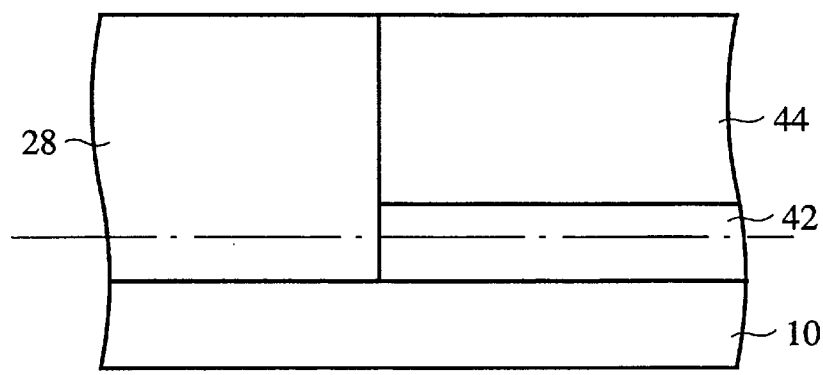
FIGS. 4A–4C are views explaining another method for forming the N-type diffused layer of the method for fabricating the semiconductor device according to the first embodiment.
Figure 4B:
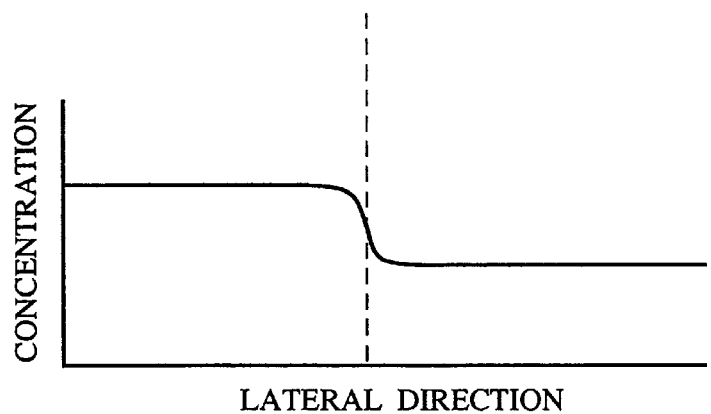
Figure 4C:
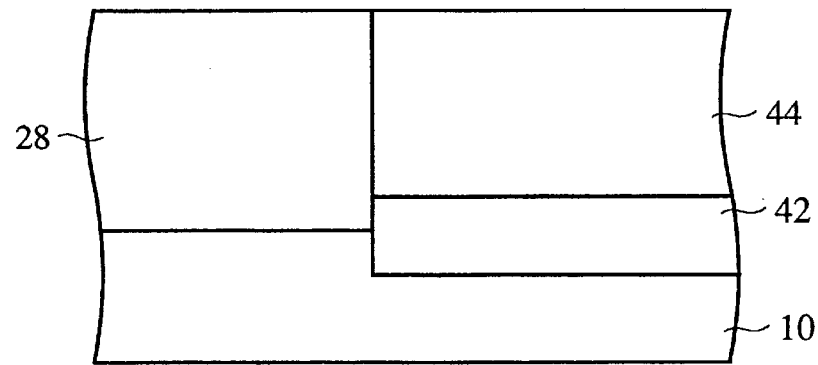

Then, with the photoresist 40 as a mask, which was used in forming the N-type diffused layer 42, boron ions are implanted to form the P-well 44 in the memory cell region 20 on the side of the surface of the silicon substrate 10 (FIG. 3A). The ion implantation is performed, for example, four times by implanting boron ions at 180 keV acceleration energy and a $5 \times 10^{12}$ cm$^{-2}$ dose, at 100 keV acceleration energy and a $2 \times 10^{12}$ cm$^{-2}$ dose, at 50 keV acceleration energy and a $1 \times 10^{12}$ cm$^{-2}$ dose and at 18 keV acceleration energy and $5 \times 10^{12}$ cm$^{-2}$ dose. The ion implantation is performed at thus varies acceleration energy and doses, whereby the so-called retrograde well can be formed.

The ion implantation at the high energy (180 keV) is for forming a heavily-doped part on the bottom of the P-well 44 and is determined by punch-through resistance and latch-up resistance between the N-type source/drain of the NMOS to be formed in the memory cell region 20 and the N-type diffused layer 42.

The ion implantation at the middle energy (100 keV) is channel stop ion implantation for retaining a threshold voltage of the field transistor sufficiently high.

The ion implantation at the low energy (50 keV, 18 keV) is for controlling a threshold voltage of the NMOS in the memory cell region 20.

The N-type diffused layer 42 has the side connected to the N-well 28. Thus, the P-wells 36, 44 have the sides surrounded by the N-well 28 and the bottoms surrounded by the N-well 28 and the N-type diffused layer 42, and are electrically isolated from the silicon substrate 10. Thus, the P-wells 36, 44 having different voltage from that of the P-well 34 can be realized.

Figure 3B:
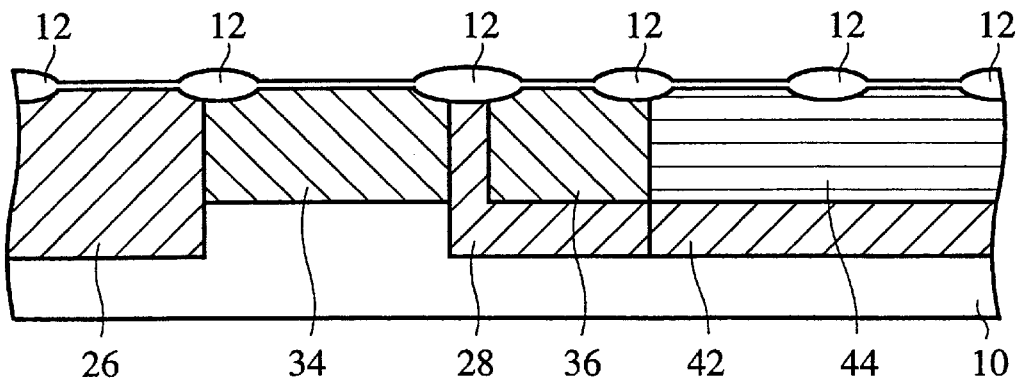

Thus, a triple-well structure constituted by the N-well 26, the P-well 34 and the different-voltage P-wells 36, 44 is formed (FIG. 3B).

Then, in the sam way as in, e.g., the usual DRAM process, peripheral circuits are formed in the PMOS region 14 and the NMOS regions 16, 18, and memory cells including transfer transistors and capacitors are formed in the memory cell region 20.

As described above, according to the present embodiment, the P-well 44 in the memory cell region 20, and the N-type diffused layer 42 are formed by the use of the same photoresist 40 as a mask, which decreases two lithography steps for forming the N-well and the N-type diffused layer to one lithography step. That is, three lithography steps are required to form the triple well structure, and, in comparison with the conventional method for forming the triple well structure by using four lithography steps, improved throughput and lower fabrication costs can be obtained.

Because the N-type diffused layer 42 for electrically isolating the P-wells 36, 44 is formed independently of the N-wells 26, 28, the ion implantation energy and dose for forming the N-type diffused layer 42 can be independently controlled.

In the present embodiment, from the viewpoint of refresh improvement in a DRAM, the P-wells 34, 36 and the P-well 44 are formed independently of each other to make the P-well 44 in the memory cell region 20 lightly doped, but for the purpose of decreasing times of the ion implantation the ion implantation for forming the P-wells 34, 36 and for forming the P-well 44 may be performed concurrently with each other. That is, in the step of FIG. 2C, the P-well 44 is formed concurrently with the P-wells 34, 36, and the ion implantation for forming the N-type diffused layer 42 and for controlling a threshold voltage of the NMOS region is performed in the step of FIG. 3A, whereby three steps of implanting ions to form the P-wells can be omitted.

Figure 5A:
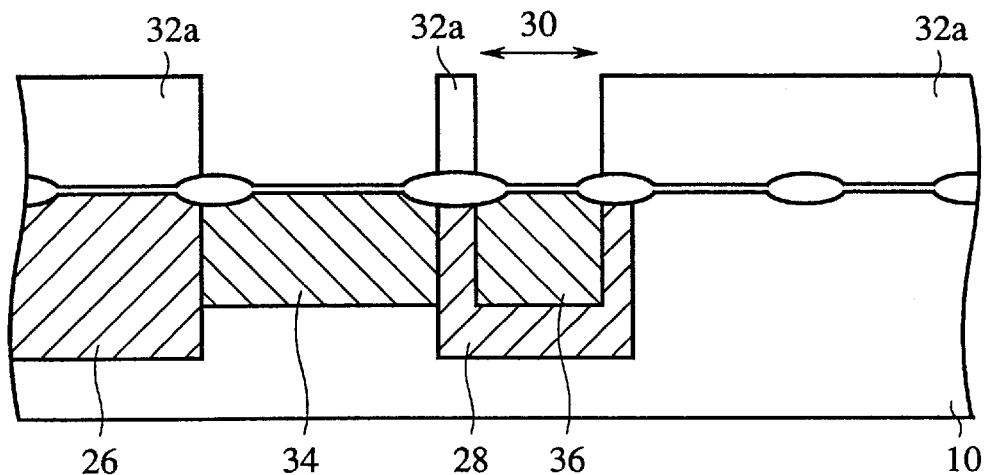
FIGS. 5A–5B are diagrammatic sectional views of a semiconductor device according to a first modification of the first embodiment, which show a structure thereof and a method for fabricating the same.
Figure 5B:
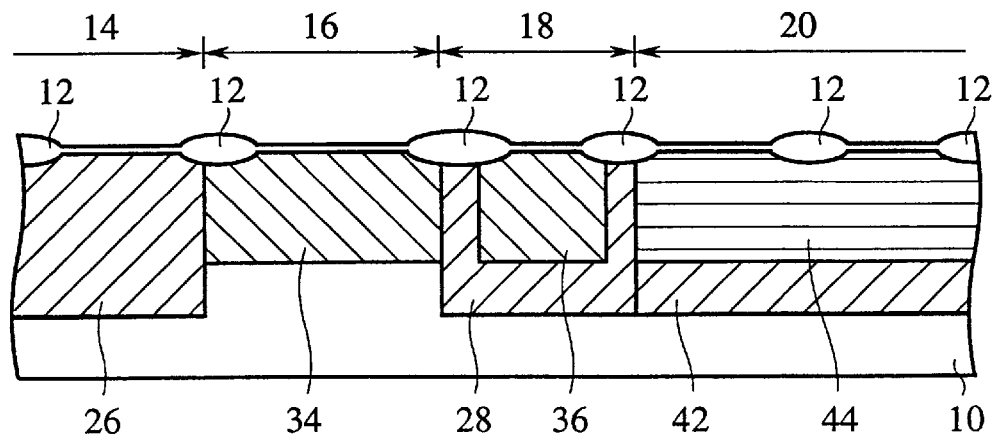

In the layout of the present embodiment, the P-well 36 and the P-well 44 are connected to each other but may be isolated by the N-well 28. That is, in the step of FIG. 2C, the P-well 36 is formed by using as a mask a photoresist 32a having an opening within the N-well 28 as shown in FIG. 5A, whereby the P-well 36 surrounded by the N-well 28 and isolated from the P-well 44 can be formed (FIG. 5B).

Figure 6A:
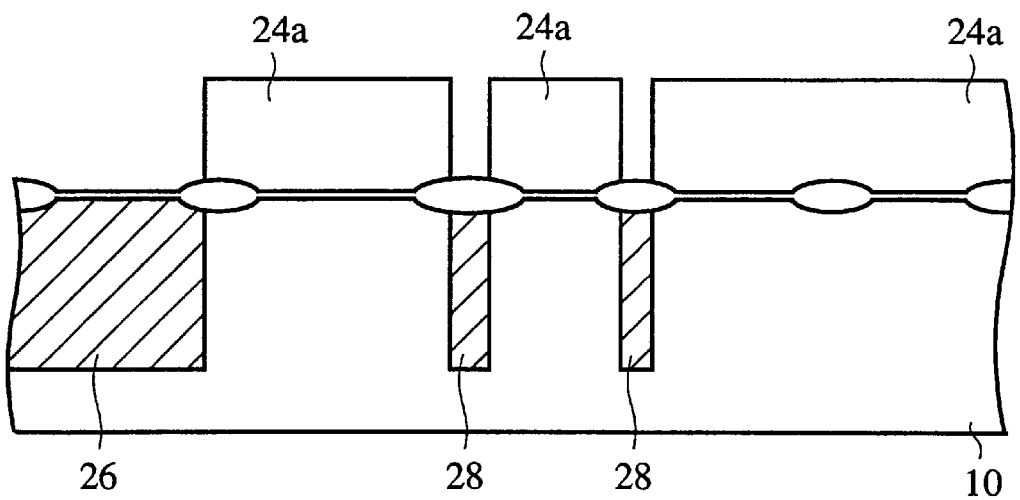
FIGS. 6A–6B are diagrammatic sectional views of a semiconductor device according to a second modification of the first embodiment, which show a structure thereof and a method for fabricating the same.
Figure 6B:
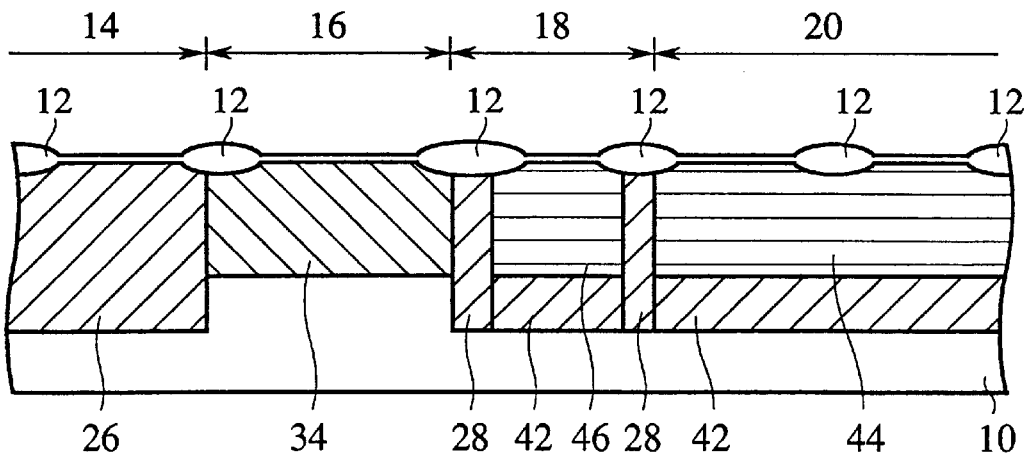

It is also possible that the P-well 44 is divided in a plurality of regions, and a part of the regions is used as the PMOS region 18 of the peripheral circuit. In the step of FIG. 2B, for example, the N-well 28 is formed by using as a mask a photoresist 24a as shown in FIG. 6A, and then a P-well 46 having the same impurity profile as the P-well 44 can be formed in the NMOS region 18 and the memory cell region 20. The P-well 44 and the P-well 46 may not be isolated from each other.

In the present embodiment, 180 keV acceleration energy is used in the ion implantation for forming the P-well 44, but for improved refresh the ion implantation may be performed at higher acceleration energy. The implantation of boron ions at, e.g., 300 keV can reduce damage to the substrate and makes a surface concentration lower in comparison with that at 180 keV acceleration energy, with a result of improved refresh.

In the present embodiment, the NMOS region is formed in the P-well 34 and the different voltage P-well 36, but it is possible to form the NMOS region in either of them.

[A Second Embodiment]

The semiconductor device according to a second embodiment of the present invention and the method for fabricating the same will be explained with reference to FIGS. 7, 8A–8B, 9A–9B, 10A–10B and 11A–11B. The same member of the second embodiment as the semiconductor device and the method for fabricating the same according to the first embodiment are represented by the same reference number not to repeat or to simplify their explanation.

Figure 7:
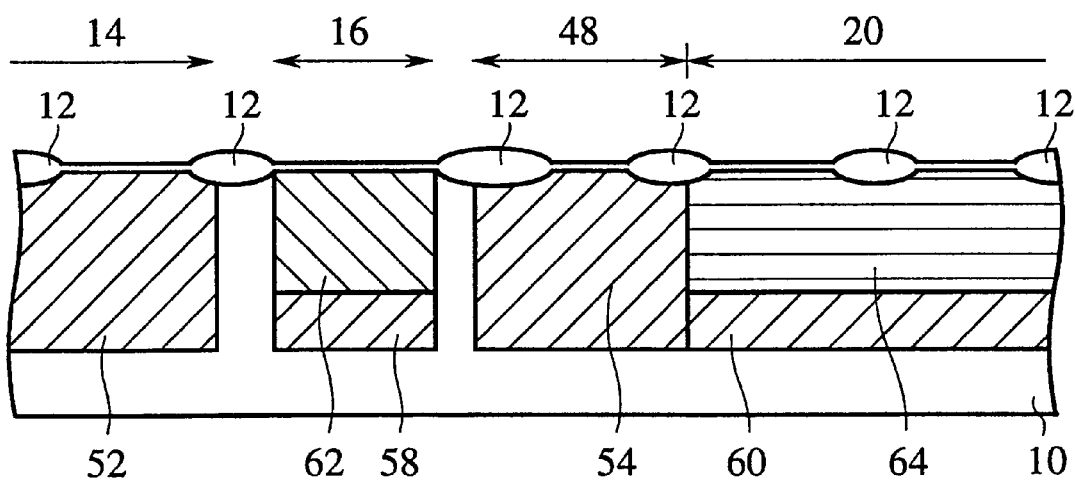
FIG. 7 is a diagrammatic sectional view of the semiconductor device according to a second embodiment of the present invention, which shows a structure thereof.

FIG. 7 is a diagrammatic sectional view of the semiconductor device according to the present embodiment, which shows a structure thereof. FIGS. 8A–8B and 9A–9B are sectional views of the semiconductor device in the steps of the method for fabricating the same, which explain the method. FIGS. 10A–10B and 11A–11B are sectional views of the semiconductor device according to modifications of the present embodiment, which explain a structure thereof and a method for fabricating the same.

First, the structure of the semiconductor device according to the present embodiment will be explained with reference to FIG. 7.

A field oxide film 12 for defining device regions is formed on a P-type silicon substrate 10. In FIG. 7 the device regions defined by the field oxide film 12 are from the left to the right as viewed in the drawing, a PMOS region 14 for a peripheral circuit, an NMOS region 16 for a peripheral circuit, a PMOS region 48 and a memory cell region 20. An N-well 52 constituting one of the usual CMOS wells is formed in the silicon substrate 10 in the PMOS region 14. A P-well 62 constituting the other of the CMOS wells is formed in the silicon substrate 10 in the NMOS region 16. The PMOS region 48 is an annular region surrounding the memory cell region 20, and an N-well 54 is formed in the PMOS region 48. In the silicon substrate 10 in the memory cell region 20, there are formed a P-well 64 formed on the side of the surface of the silicon substrate 10 and an N-type diffused layer 60 formed on the bottom of the P-well 64. The N-well 54 is formed in the annular region surrounding the P-well 64 and is connected to an N-type diffused layer 60 in the silicon substrate 10. Thus, the P-well 64 is electrically isolated from the silicon substrate 10 by the N-well 54 and the N-type diffused layer 60. On the bottom of the P-well 62, there is formed an N-type diffused layer 58 which does not prohibit connection between the silicon substrate 10 and the P-well 62.

The N-wells 52, 54, the P-well 62 and the different voltage P-well 64 thus constitute a triple well structure.

Such triple well structure allows, in, e.g., a DRAM, the PMOS regions 14, 48 and the NMOS region 16 to be used as regions for logic circuits to be formed in, and the memory cell region 20 to be used as a region for a memory array to be arranged in.

A major characteristic of the semiconductor device according to the present embodiment is that a concentration of the N-well 54, and a concentration and a depth of the N-type diffused layer 60 covering the bottom of the P-well 64 can be varied independently of each other. Such structure of the semiconductor device permits the N-type diffused layer 60 covering the bottom of the P-well 64 to have a concentration adjusted in accordance with characteristics of devices respectively formed in the PMOS region 48 and the memory cell region 20. It also characterizes the semiconductor device according to the present embodiment that the N-type diffused layer 58 is formed on the bottom of the P-well 62.

The present invention will be detailed below in accordance with the steps of the method for fabricating the semiconductor device according to the present embodiment.

First, the field oxide film 12 is formed on the P-type silicon substrate by, e.g., the usual LOCOS method to define the device regions.

Figure 8A:
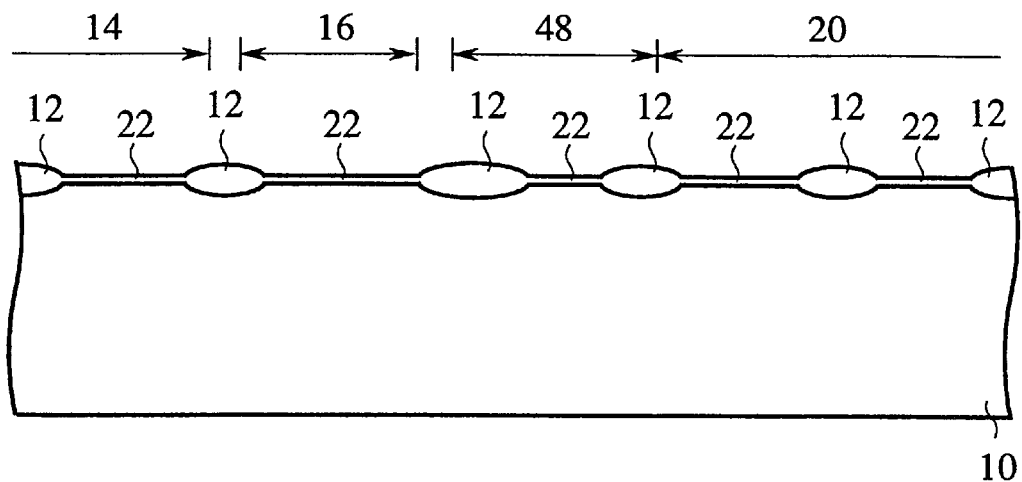
FIGS. 8A–8B and 9A–9B are sectional views of the semiconductor device in the steps of the method for fabricating the semiconductor device, which explain the method.

Next, the silicon substrate 10 is thermally oxidized by, e.g., dry oxidation at 900° C. to form an about 10 nm-thick silicon oxide film 22 in the device regions (FIG. 8A).

Subsequently a photoresist 50 exposing the PMOS regions 14, 48 is formed by the usual lithography techniques. The PMOS region 48 is an annular region surrounding the memory cell region 20.

Figure 8B:
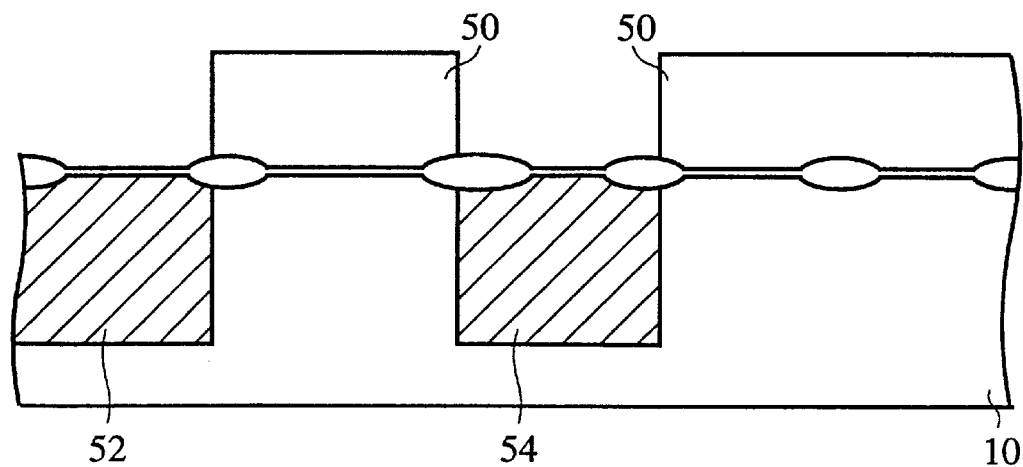

Then, phosphorus ions are implanted with the photoresist 50 as a mask to form the N-well 52 in the silicon substrate 10 in the PMOS region 14 and the N-well 54 in the silicon substrate 10 in the PMOS region 48 (FIG. 8B).

For example, phosphorus ions are implanted, for example, three times at 1 MeV acceleration energy and a $3 \times 10^{13}$ cm$^{-2}$, at 200 keV acceleration energy and a $4 \times 10^{12}$ cm$^{-2}$ dose, and at 80 keV and a $1 \times 10^{12}$ cm$^{-2}$ dose.

Then, the photoresist 50 is removed, and then a photoresist 56 exposing the NMOS region 16 and the memory cell region 20 by the usual lithography techniques.

Subsequently, with the photoresist 56 as a mask, phosphorus ions are implanted to form the N-type diffused layer 58 in the silicon substrate 10 in the NMOS region 16 and the N-type diffused layer 60 in the silicon substrate 10 in the memory cell region 20. Phosphorus ions are implanted at, e.g., 1 MeV acceleration energy and a $3 \times 10^{13}$ cm$^{-2}$ dose.

At this time, the N-type diffused layer 58 is formed so as to isolate from the N-wells 52, 54. On the other hand, the N-type diffused layer 60 is formed so as to connect to the N-well 54. Thus, the region of the silicon substrate 10 surrounded by the N-type diffused layer 60 and the N-well 54 are electrically isolated from the other region of the silicon substrate 10.

Ion implanting conditions for forming the N-type diffused layer 60 are the same as in the first embodiment and are not essentially the same as the ion implanting conditions at the highest energy for forming the N-wells 52, 54. It is preferable that the ion implanting conditions are adjusted suitably for required characteristics, such as refresh characteristic.

Figure 9A:
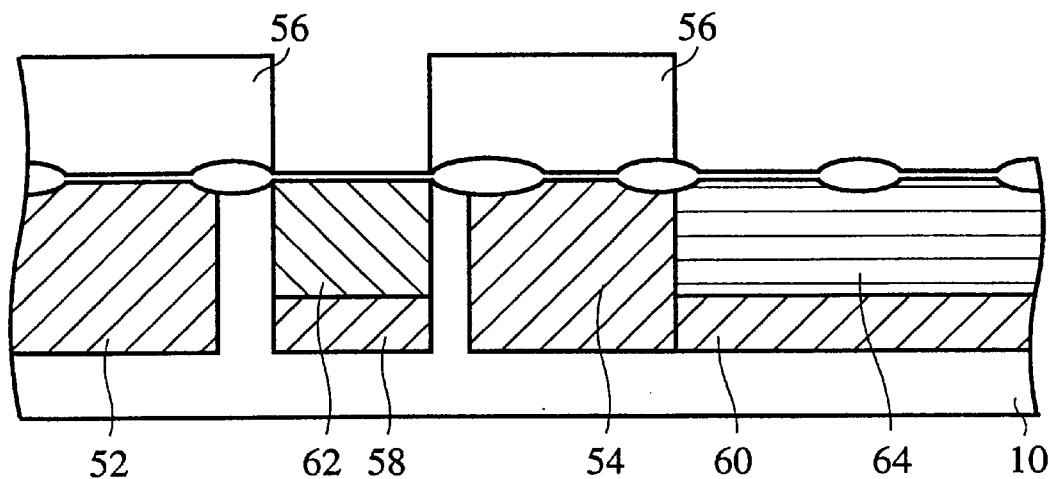

Then, with the photoresist 56 as a mask, which has been used in forming the N-type diffused layers 58, 60, boron ions are implanted to form the P-well 62 in the silicon substrate 10 on the side of the surface thereof in the NMOS region 16, and the P-well 64 in the silicon substrate 10 on the side of the surface thereof in the memory cell region 20 (FIG. 9A). Boron ions are implanted at, e.g., 300 keV acceleration energy and a $3 \times 10^{13}$ cm$^{-2}$ dose, at 80 keV acceleration energy and a $4 \times 10^{12}$ cm$^{-2}$ dose, and at 30 keV acceleration energy and a prescribed dose.

The ion implantation at the higher energy (300 keV) is for forming heavily doped portions on the bottoms of the P-wells 62, 64 and is determined by punch-through resistance and latch-up resistance between the N-type source/drain of the NMOS formed in the memory cell region 20 and the N-type diffused layer 60.

The ion implantation at the middle energy (80 keV) is channel stop ion implantation for keeping a threshold voltage of the field transistor sufficiently high.

The ion implantation at the low energy (30 keV) is for controlling threshold voltages of the NMOS regions 16, 20.

Because the thus-formed P-well 62 is formed on the N-type diffused layer 58, which is not connected to the N-wells 52, 54, the P-well remains electrically connected to the silicon substrate 10. On the other hand, the P-well 64 is surrounded by the N-type diffused layer 60 and the N-well 54 and is formed in the region electrically isolated from the silicon substrate 10.

Figure 9B:
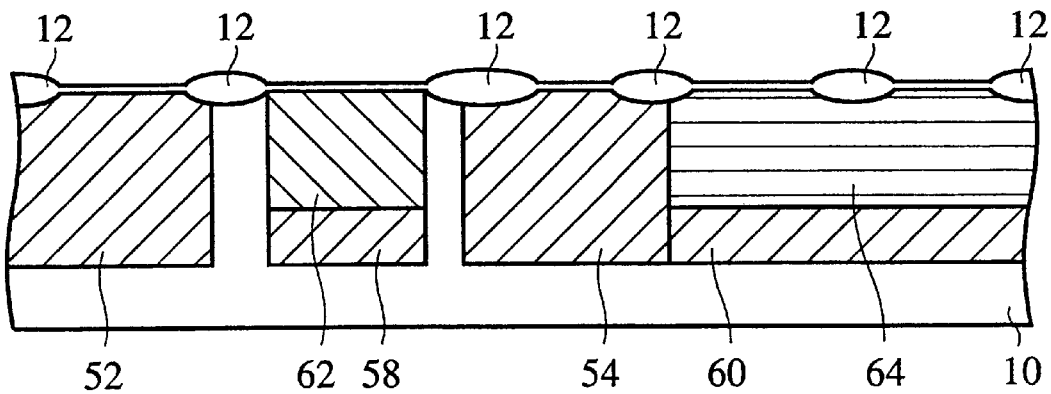

Thus, the N-wells 52, 54, the P-well 62 and the different voltage P-well 64 constitute a triple well structure (FIG. 9B).

Next, in the same way as, e.g., the usual DRAM process, peripheral circuits are formed in the PMOS region 14 and the NMOS region 16, and memory cells including transfer transistors and capacitors are formed in the memory cell region 20.

As described above, according to the present embodiment, because the P-well 64 in the memory cell region 20, and the N-type diffused layer 60 are formed by using the same photoresist 56 as a mask, and the usual P-well 62 and the different voltage P-well 64 are concurrently formed, the lithography steps required for forming the N-well and the N-type diffused layer can be decreased by one step. That is, the triple well forming process requires two lithography steps and can improve throughput and reduce fabrication costs in comparison with the conventional method for forming a triple well structure requiring four lithography steps.

Because the N-type diffused layer 60 for electrically isolating the P-well 60 is formed independently of the N-wells 52, 54, it is possible that ion implantation energy and a dose for forming the N-type diffused layer 60 are controlled in accordance with characteristics required for the memory cell region 20.

Figure 10A:
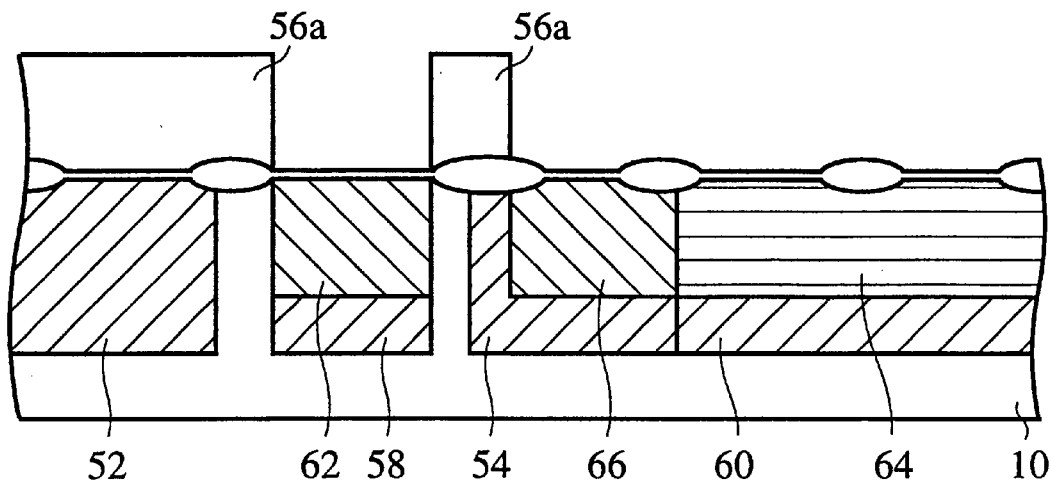
FIGS. 10A–10B are diagrammatic sectional views of a semiconductor device according to a first modification of the second embodiment, which show a structure thereof and a method for fabricating the same.
Figure 10B:
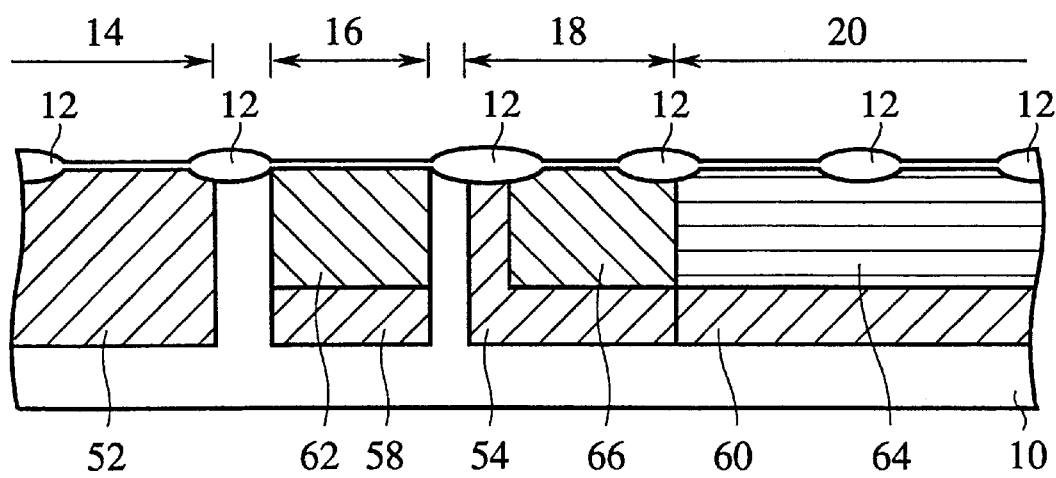
Figure 11A:
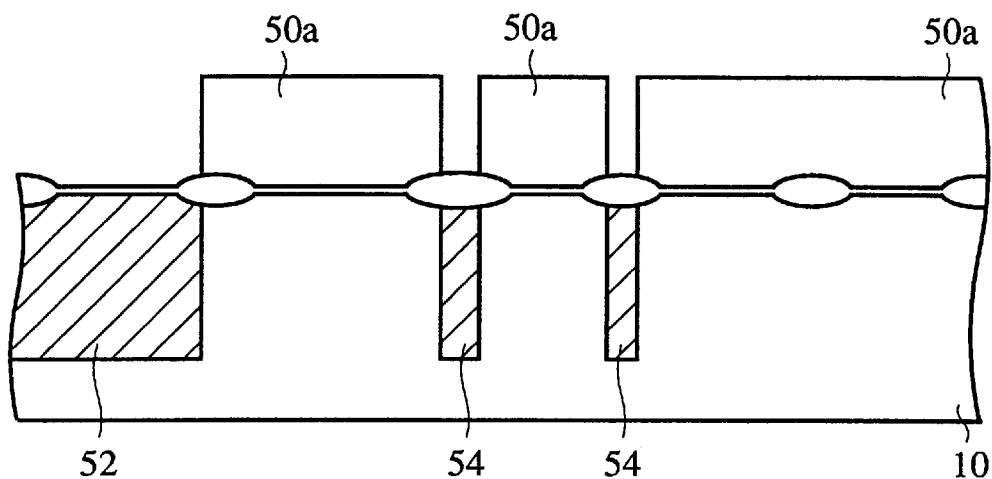
FIGS. 11A–11B are diagrammatic sectional views of a semiconductor device according to a second modification of the second embodiment, which show a structure thereof and a method for fabricating the same.
Figure 11B:
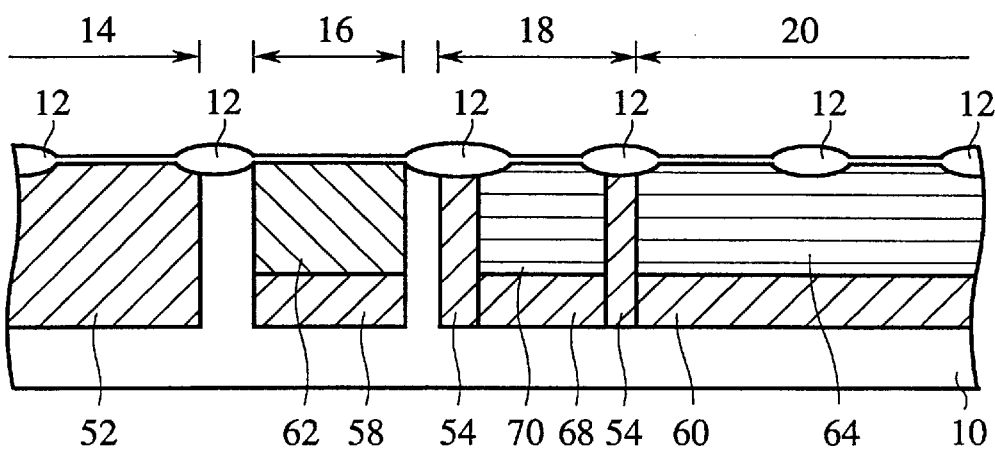

In the present embodiment, the different voltage P-well for a peripheral circuit is not formed in the way that semiconductor device according to the first embodiment is formed but can be formed without complicating the fabrication steps. For example, in the step of FIG. 9A the photoresist 56a shown in FIG. 10A is formed, and boron ions for forming the P-well 64 are implanted also in the region with the N-well 54 formed in, whereby the different voltage P-well 66 for a peripheral circuit and the different voltage P-well 64 for the memory cells electrically isolated from the silicon substrate 10 by the N-well 54 and the N-type diffused layer 60 can be formed. In this case, it is possible that the P-well 64 and the P-well 66 are isolated from each other as in, e.g., the semiconductor device shown in FIGS. 5A and 5B.

It is also possible that the P-well 64 is divided in a plurality of regions, and a part of the regions is used as the NMOS region 18 for a peripheral circuit. For example, in the step of FIG. 8B, the N-wells 52, 54 are formed with the photoresist 50a shown in FIG. 11A as a mask, and in the step of FIG. 9A the P-well is formed also between the N-wells 54, whereby the P-well 70 having the same dopant profile as the P-well 64 and electrically isolated from the silicon substrate 10 by the N-well 54 and the N-type diffused layer 68 can be further formed. The P-well 64 and the P-well 70 may be not isolated from each other.

Figure 12A:
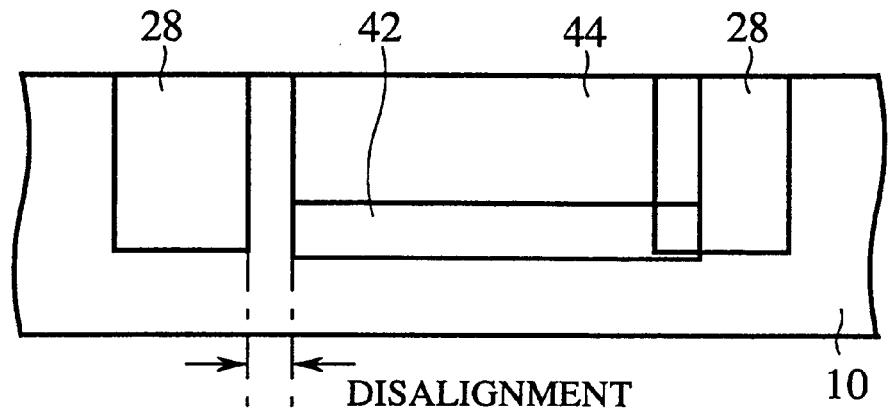
FIGS. 12A–12B are views explaining a problem and a method for solving the problem of the semiconductor device according to the first and the second embodiments.

In the semiconductor device according to the first embodiment shown in FIG. 1, a connection is present between the N-well 28 and the N-type diffused layer 42. In the semiconductor device according to the second embodiment shown in FIG. 7, a connection is present between the N-well 54 and the N-type diffused layer 60. If disalignment occurs between these N-wells and the N-type diffused layers as shown in FIG. 12A, a gap is formed between the N-well 28 and N-type diffused layer 42, with a result that the P-well 44 surrounded by the N-well 28 and the N-type diffused layer 42, and the silicon substrate 10 cannot be electrically isolated from each other, and the wells cannot be used as different voltage wells.

Figure 12B:
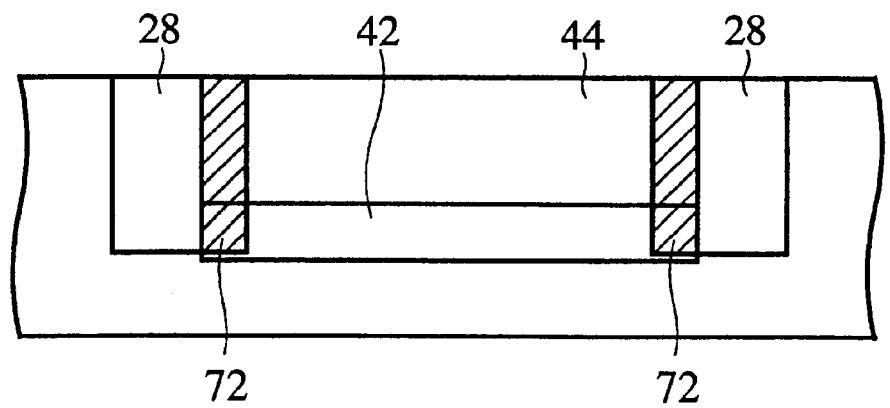

To solve such problem it is effective that, as exemplified in FIG. 12B, a shift is provided in consideration of disalignment to form a region 72 where the patterns overlap by each other.

Figure 13:
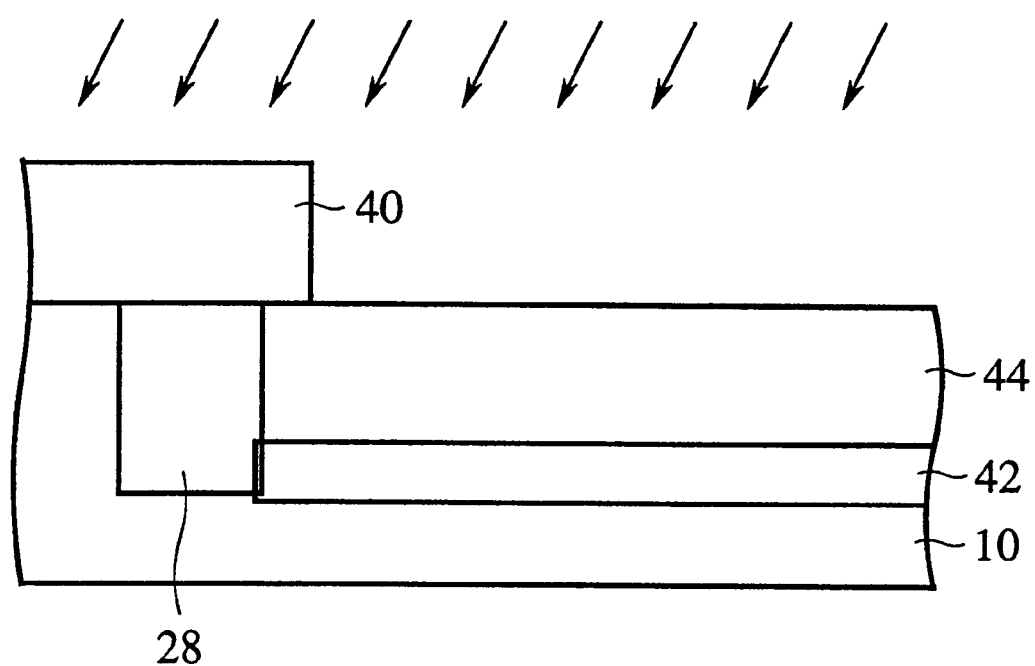
FIG. 13 is a view explaining a method for solving the problem of the semiconductor device according to the first and the second embodiments.
Figure 14A:
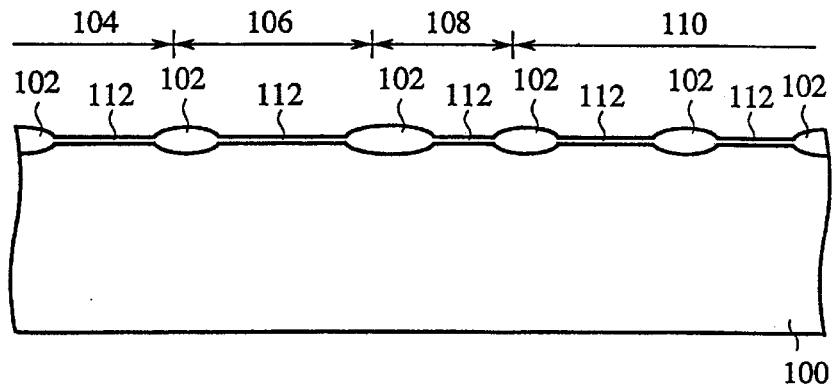
FIGS. 14A–14C, 15A–15C and 16A–16C are views of the conventional semiconductor device in the steps of the method for fabricating the same, which explain the method.
Figure 14B:
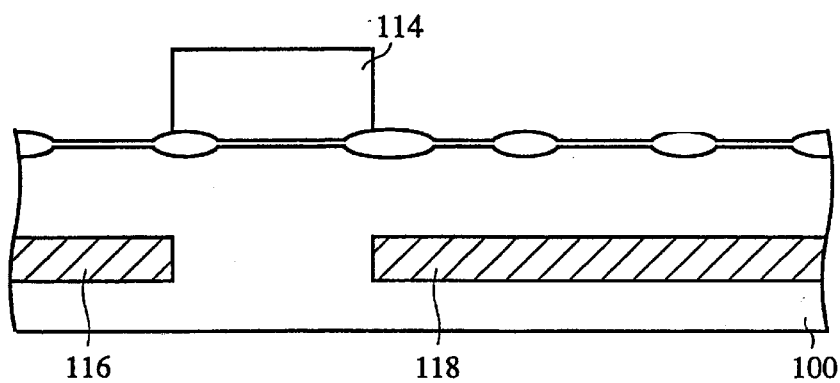
Figure 14C:
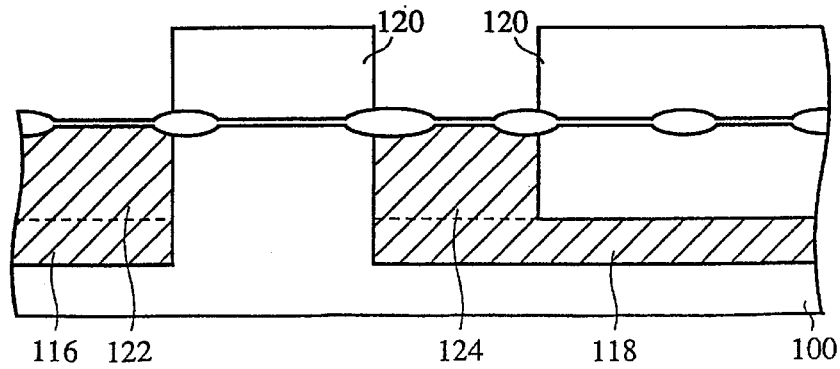
Figure 15A:
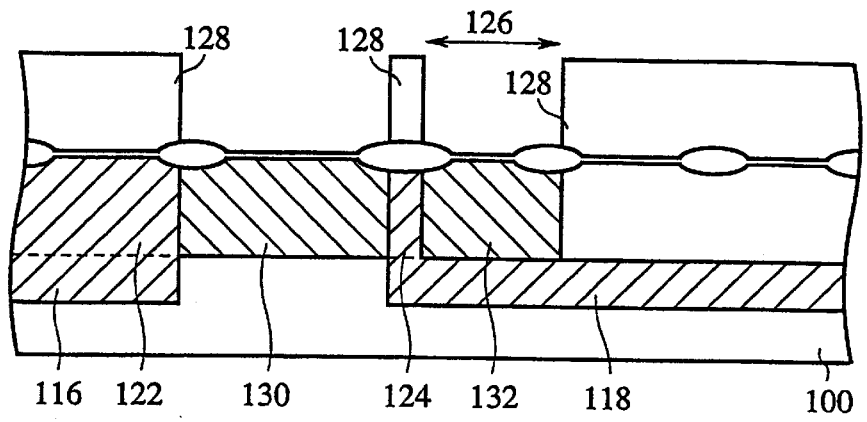
Figure 15B:
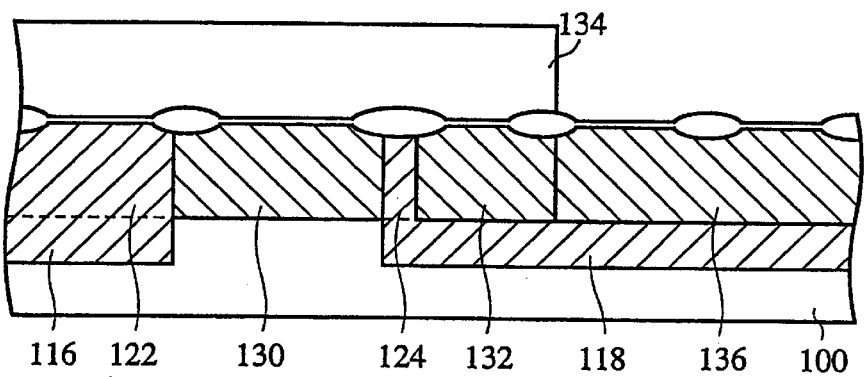
Figure 15C:
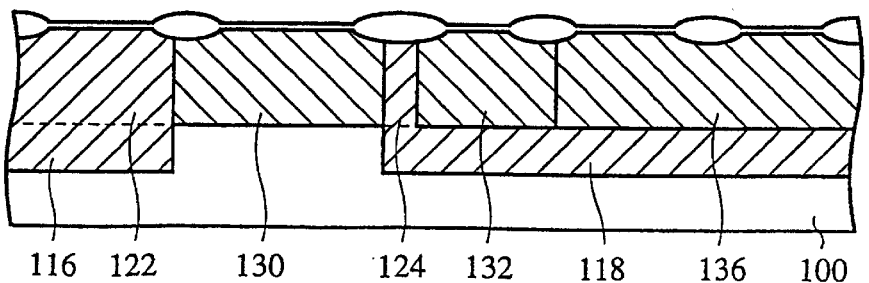
Figure 16A:
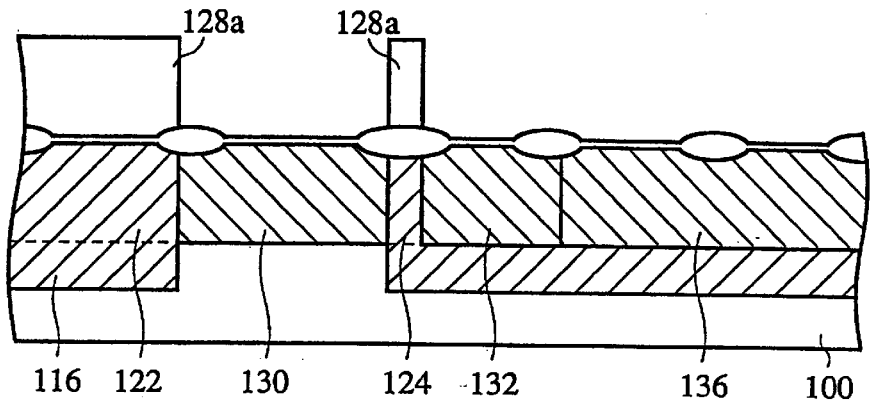
Figure 16B:
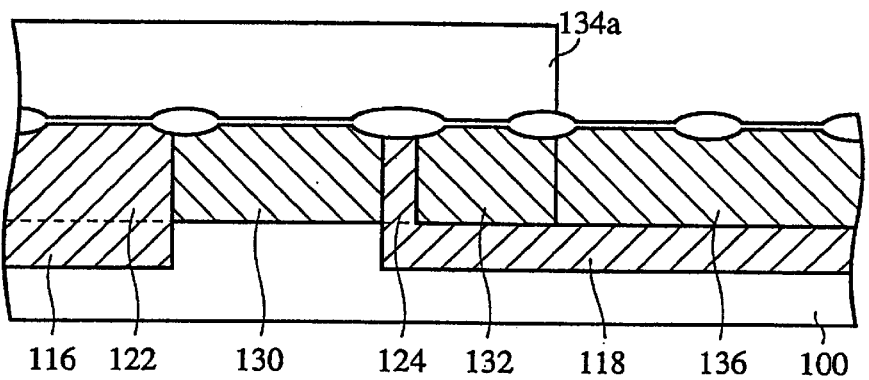
Figure 16C:
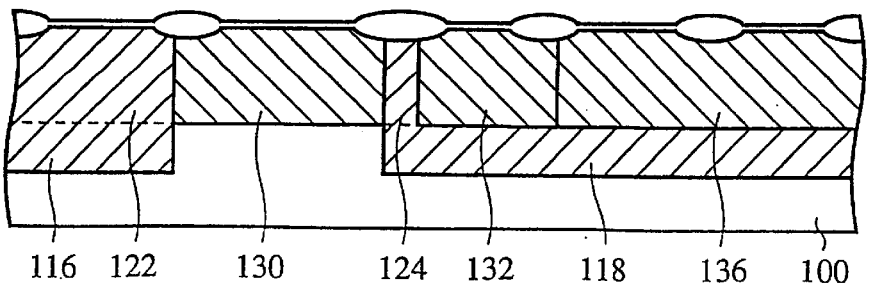

It is also effective that, as shown in FIG. 13, at least either of the ion implanting step for forming the N-well 28 and the ion implanting step for forming the N-type diffused layer 42 ions are implanted in a direction tilted at a certain angle, e.g., 7° to the normal direction of the silicon substrate, whereby the N-well 28 and the N-type diffused layer 42 overlap each other.

In the first and the second embodiments, the memory cell region 20 is disposed in the P-well 44 or P-well 64 electrically isolated from the silicon substrate 10, but the memory cell region 20 is not essentially formed in such well. That is, it is possible that the NMOS region 16 for a peripheral circuit is formed in the P-well 44 or P-well 64 electrically isolated from the silicon substrate 10, and the memory cell region 20 is formed in the P-well 34 or P-well 62 formed in the silicon substrate 10. In all these cases the memory cell region 20 and the NMOS region 16 can be formed in the wells having voltages different from each other.

In the first and the second embodiments, the ion implanting steps are performed in a sequence which makes clear the relationships among the respective wells and the diffused layers but may be performed in a different sequence. For example, in the method for fabricating the semiconductor device according to the first embodiment, the P-well 44 and the N-type diffused layer 42 may be first formed, or the P-wells 34, 36 may be first formed. When the ion implantation is performed plural times with one photoresist as a mask, the ion implantation at any energy may be first performed.

In the first and the second embodiments, the triple well of the present invention is applied to a dram, but is not essentially applied to drams and is applicable to various devices

What is claimed is:

1. A method for fabricating a semiconductor device comprising the steps of:
    forming a first photoresist film having a first opening in a first region on a semiconductor substrate of a first conductivity type;
    forming a first well of a second conductivity type different from the first conductivity type in the first region with the first photoresist film as a mask;
    removing the first photoresist film;
    forming a second photoresist film having a second opening in a second region contacting the first region on the semiconductor substrate;
    forming a first buried layer of the second conductivity type in the second region with the second photoresist film as a mask, the first buried layer being buried in the semiconductor substrate; and
    removing the second photoresist film,
    whereby a second well of the first conductivity type, which is electrically isolated from a rest region of the semiconductor substrate by the first well and the first buried layer, is formed in the second region.

2. A method for fabricating a semiconductor device according to claim 1, further comprising the step of:
    forming a third photoresist film having a third opening in the first region on the semiconductor substrate;
    forming a third well of the first conductivity type in the first region on the side of the surface of the semiconductor substrate, the third well being electrically isolated from the rest region of the semiconductor substrate by the first well and the first buried layer; and
    removing the third photoresist film.

3. A method for fabricating a semiconductor device according to claim 1, further comprising the steps of:
    forming a third photoresist film having a third opening in the second region and a fourth opening in a third region on the semiconductor substrate;
    forming the second well of the first conductivity type in the second region and a third well of the first conductivity type in the third region with the third photoresist film as a mask, the third well being electrically connected to the rest region of the semiconductor substrate; and
    removing the third photoresist film.

4. A method for fabricating a semiconductor device according to claim 2, wherein
    in the step of forming the third photoresist film, the third photoresist film further including a fourth opening in a third region is formed, and
    in the step of forming the third well, a fourth well of the first conductivity type is concurrently formed in the third region, the fourth well being electrically connected to the rest region of the semconductor substrate.

5. A method for fabricating a semiconductor device according to claim 3, wherein
    in the step of forming the second photoresist film, the second photoresist film further including a fifth opening in the third region is formed, and
    in the step of forming the first buried layer, a second buried layer of the second conductivity type is concurrently formed below the third well.

6. A method for fabricating a semiconductor device according to claim 4, wherein
    in the step of forming the second photoresist film, the second photoresist film further including a fifth opening in the third region is formed, and
    in the step of forming the first buried layer, a second buried layer of the second conductivity type is concurrently formed below the fourth well.

7. A method for fabricating a semiconductor device according to claim 1, further comprising the steps of:
    forming the second well in the second region with the second photoresist film as a mask.

8. A method for fabricating a semiconductor device according to claim 1, wherein
    in the step of forming the first well, the first well is formed by plural times of ion implantation, which are different from each other in acceleration energy and dosage.

9. A method for fabricating a semiconductor device according to claim 1, wherein in the step of forming the first well and/or the step of forming the first buried layer, the ion implantation is performed in a direction tilted with respect to a normal direction of the semiconductor substrate.

10. A method for fabricating a semiconductor device according to claim 1, wherein the first photoresist film for forming the first well and the second photoresist film for forming the first buried layer have regions between the first region and the second region, in which the first opening and the second opening overlap each other.

11. A method for fabricating a semiconductor device according to claim 7, wherein a dose for the ion implantation for forming the second well is smaller than a dose for the ion implantation for forming the third well.

12. A method for fabricating a semiconductor device according to claim 7, wherein acceleration energy for the ion implantation for forming the second well is higher than acceleration energy for the ion implantation for forming the third well.

13. A method for fabricating a semiconductor device according to claim 1, wherein a dose of the ion implantation for forming the first buried layer is smaller than a dose for the ion implantation at a highest acceleration energy for forming the first well.

14. A method for fabricating a semiconductor device according to claim 1, wherein acceleration energy for the ion implantation for forming the first buried layer is higher than acceleration energy for the ion implantation for forming the first well.

15. A method for fabricating a semiconductor device according to claim 1, wherein the second well is formed by plural times of ion implantation, which are different from each other in acceleration energy and dosage.

* * * * *